US009846587B1

(12) United States Patent
Schumacher et al.

(10) Patent No.: US 9,846,587 B1
(45) Date of Patent: Dec. 19, 2017

(54) PERFORMANCE ANALYSIS USING CONFIGURABLE HARDWARE EMULATION WITHIN AN INTEGRATED CIRCUIT

(71) Applicant: Xilinx, Inc., San Jose, CA (US)

(72) Inventors: Paul R. Schumacher, Berthoud, CO (US); Graham F. Schelle, Longmont, CO (US); Patrick Lysaght, Los Gatos, CA (US); Yi-Hua Yang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 752 days.

(21) Appl. No.: 14/278,263

(22) Filed: May 15, 2014

(51) Int. Cl.
*G06F 9/455* (2006.01)
(52) U.S. Cl.
CPC .................... *G06F 9/455* (2013.01)
(58) Field of Classification Search
CPC ........................................ G06F 9/455
USPC ........................................... 703/23
See application file for complete search history.

(56) References Cited

U.S. PATENT DOCUMENTS

| 5,327,361 | A | 7/1994 | Long et al. | |
|---|---|---|---|---|
| 5,548,785 | A | 8/1996 | Fogg et al. | |
| 5,937,179 | A | 8/1999 | Swoboda | |
| 5,946,472 | A * | 8/1999 | Graves | G06F 11/261 703/16 |
| 6,732,068 | B2 * | 5/2004 | Sample | G01R 31/2853 326/40 |
| 6,810,442 | B1 * | 10/2004 | Lin | G06F 17/5022 703/27 |
| 7,065,481 | B2 * | 6/2006 | Schubert | G01R 31/318357 438/14 |
| 7,155,708 | B2 * | 12/2006 | Hammes | G06F 17/5022 717/132 |
| 7,290,228 | B2 | 10/2007 | Guenther et al. | |
| 7,444,276 | B2 | 10/2008 | Watt et al. | |
| 7,756,695 | B2 | 7/2010 | O'Niell et al. | |
| 7,769,577 | B2 | 8/2010 | Guenther et al. | |
| 7,865,346 | B2 | 1/2011 | Guenther et al. | |
| 7,877,249 | B2 | 1/2011 | Guenther et al. | |

(Continued)

OTHER PUBLICATIONS

McVoy et al. ("Imbench: Portable Tools for Performance Analysis", Proceedings of the USENIX 1996 Annual Technical Conference, 1996, pp. 1-17).*

(Continued)

*Primary Examiner* — Omar Fernandez Rivas
*Assistant Examiner* — Iftekhar Khan
(74) *Attorney, Agent, or Firm* — Kevin T. Cuenot

(57) ABSTRACT

A system includes a host data processing system and a target platform coupled to the host data processing system. The target platform includes an emulation system. The emulation system includes a processor system, an emulation circuit coupled to the processor system through an integrated circuit (IC) interconnect, and a performance monitor coupled to the IC interconnect. The emulation system receives, from the host data processing system, a software emulation model and a data traffic pattern. The emulation system emulates a system architecture by executing the software emulation model within the processor system and implementing the data traffic pattern over the IC interconnect using the emulation circuit. The emulation system provides, to the host data processing system, measurement data collected by the performance monitor during the emulation.

18 Claims, 10 Drawing Sheets

(56) References Cited

U.S. PATENT DOCUMENTS

| | | | |
|---|---|---|---|
| 8,806,403 B1* | 8/2014 | Denisenko | G06F 17/5054 |
| | | | 716/116 |
| 9,081,925 B1* | 7/2015 | Schumacher | G06F 17/5022 |
| 9,529,946 B1* | 12/2016 | Schumacher | G06F 17/5022 |
| 2003/0105617 A1 | 6/2003 | Cadambi et al. | |
| 2004/0025122 A1* | 2/2004 | Schubert | G06F 17/504 |
| | | | 716/106 |
| 2004/0054992 A1* | 3/2004 | Nair | G06F 8/443 |
| | | | 717/138 |
| 2004/0078179 A1 | 4/2004 | Fuji et al. | |
| 2004/0123258 A1 | 6/2004 | Butts | |
| 2004/0193957 A1* | 9/2004 | Swoboda | G06F 8/41 |
| | | | 714/30 |
| 2005/0256696 A1* | 11/2005 | Gooding | G06F 17/5027 |
| | | | 703/23 |
| 2006/0155525 A1 | 7/2006 | Aguilar et al. | |
| 2006/0190232 A1* | 8/2006 | Guenther | G06F 17/5022 |
| | | | 703/15 |
| 2007/0044079 A1 | 2/2007 | Ganesan et al. | |
| 2007/0067150 A1* | 3/2007 | Musselman | G06F 17/5022 |
| | | | 703/14 |
| 2007/0074000 A1 | 3/2007 | Colwill et al. | |
| 2007/0162270 A1 | 7/2007 | Guenther et al. | |
| 2007/0219771 A1 | 9/2007 | Verheyen et al. | |
| 2007/0294071 A1 | 12/2007 | Guenther et al. | |
| 2008/0222633 A1* | 9/2008 | Kami | G06F 9/45558 |
| | | | 718/1 |
| 2008/0243462 A1* | 10/2008 | Guenther | G06F 11/261 |
| | | | 703/15 |
| 2008/0288230 A1* | 11/2008 | Fernsler | G01R 31/31704 |
| | | | 703/14 |
| 2008/0306721 A1 | 12/2008 | Yang | |
| 2008/0306722 A1 | 12/2008 | Fujii et al. | |
| 2009/0254525 A1* | 10/2009 | Srinivasan | G06F 17/3056 |
| 2010/0201695 A1* | 8/2010 | Hill | G06T 15/005 |
| | | | 345/503 |
| 2011/0035203 A1* | 2/2011 | Dalton | G06F 17/5009 |
| | | | 703/14 |
| 2011/0107162 A1 | 5/2011 | Martinez Canedo et al. | |
| 2011/0283131 A1* | 11/2011 | Yamamoto | G06F 1/28 |
| | | | 713/340 |
| 2011/0307233 A1* | 12/2011 | Tseng | G06F 17/5022 |
| | | | 703/14 |
| 2012/0144216 A1* | 6/2012 | Hsieh | G06F 17/5022 |
| | | | 713/320 |
| 2012/0144376 A1* | 6/2012 | Van Eijndhoven | G06F 8/456 |
| | | | 717/146 |
| 2012/0284446 A1* | 11/2012 | Biran | G06F 13/4022 |
| | | | 710/306 |
| 2013/0170525 A1* | 7/2013 | Asaad | G06F 17/5027 |
| | | | 375/219 |
| 2013/0212554 A1* | 8/2013 | Maeda | G06F 8/35 |
| | | | 717/105 |
| 2014/0107999 A1* | 4/2014 | Frenkil | G06F 17/5009 |
| | | | 703/17 |

OTHER PUBLICATIONS

Shobaki et al. ("A Hardware and Software Monitor for High-Level System-on-Chip Verification", IEEE, 2001, pp. 56-61).*

Kyung et al. ("Performance Monitor Unit Design for an AXI-based Multi-Core SoC Platform", ACM, 2007, pp. 1565-1572).*

Specification and drawings for U.S. Appl. No. 14/280,211, filed May 16, 2014, Schumacher et al.

Berkeley Design Technology, Inc., *An Independent Evaluation of: The AutoESL AutoPilot High-Level Synthesis Tool*, copyright 2010, pp. 1-14, Berkeley Design Technology, Inc., Walnut Creek, California, USA.

Description and drawings from U.S. Appl. No. 13/398,790, filed Feb. 16, 2012, Schumacher et al.

Description and drawings from U.S. Appl. No. 13/676,035, filed Nov. 13, 2012, Schumacher et al.

ARM, Inc., *ARM Profiler Non-Intrusive Performance Analysis*, pp. 1-3, announced by ARM Jul. 6, 2010, retrieved from the Internet: <http://www.ann.com/products/tools/software-tools/rvds/arm-profiler.php>, ARM Inc., San Jose, California, USA.

Kyung, Hyun-Min et al., "Performance Monitor Unit Design for an AXI-based Multi-Core SoC Platform," *Proc. of 2007 ACM Symposium on Applied Computing*, Mar. 11, 2007, pp. 1565-1572, ACM, New York, New York, USA.

Park, Gi-Ho et al., "Building Various Levels of SOC Architecture Exploration Environments: System Level Simulator, Emulator and FPGA Prototype Board," *Proc. of the 2nd Workshop on Architectural Research Prototyping*, Jun. 9, 2007, pp. 1-5, retrieved from the Internet: <http://groups.csail.mit.edu/cag/warp2007/abstracts/park-samsungelectronics.pdf>.

Pratt, Brian et al., "Improving FPGA Design Robustness with Partial TMR," *44th Annual IEEE International Physics Symposium Proceedings*, Mar. 26, 2006, pp. 226-232, IEEE, Piscataway, New Jersey, USA.

Xilinx, Inc., *AXI Bus Functional Model v1.9*, PB 001, Jun. 22, 2011, pp. 1-3, Xilinx, Inc., San Jose, California, USA.

Xilinx, Inc., *AXI Bus Functional Model v2.1*, DS824, Oct. 19, 2011, pp. 1-51, Xilinx, Inc., San Jose, California, USA.

* cited by examiner

700

| Target Platform | CONNECTED | — 702 |
| --- | --- | --- |
| Board Selection | Board Model No. | — 704 |
| IP Address | 192.168.2.99 | — 706 |
| PS Clock Frequency (MHz) | 666.7 | — 708 |
| PC Clock Frequency (MHz) | 142.9 | — 710 |
| DDR Clock Frequency (MHz) | 533.3 | — 712 |
| DDR Data Path Width | 32 | — 714 |
| DDR Port 0 – Priority (L2 Cache) | Low | — 716 |
| DDR Port 1 – Priority (Switch) | Low | — 718 |
| DDR Port 2 – Priority (HP2/HP3) | Low | — 720 |
| DDR Port 3 – Priority (HP0/HP1) | Low | — 722 |
| DDR Port 0 – Enable HPR | ☐ False | — 724 |
| DDR Port 1 – Enable HPR | ☐ False | — 726 |
| DDR Port 2 – Enable HPR | ☐ False | — 728 |
| DDR Port 3 – Enable HPR | ☐ False | — 730 |
| HPR/LPR Queue Partitioning | HPR(0) / LPR(32) | |
| LPR to Critical Priority Level | 2 | |
| HPR to Critical Priority Level | 15 | |
| Write to Critical Priority Level | 2 | |

FIG. 7

| Testcase | Description | Port | Operation | Addr_Start | Addr_Nxt | Beats /tranx | Tranx int. | AXI:qos | Est. Thoughput (MB/sec) |
|---|---|---|---|---|---|---|---|---|---|
| Default 0 | RD/WR on all ports | HP0 | RD | ddr | increment | 8 | 100 | 0 | 91 |
| | | HP1 | RD | ddr | increment | 8 | 90 | 0 | 102 |
| | | HP2 | RD | ddr1 | increment | 8 | 80 | 0 | 114 |
| | | HP3 | RD | ddr2 | increment | 8 | 70 | 0 | 131 |
| | | ACP | RD | ddr3 | random, 4KB | 8 | 60 | 0 | 152 |
| | | HP0 | WR | ddr | increment | 8 | 100 | 0 | 91 |
| | | HP1 | WR | ddr | increment | 8 | 90 | 0 | 102 |
| | | HP2 | WR | ddr1 | increment | 8 | 80 | 0 | 114 |
| | | HP3 | WR | ddr2 | increment | 8 | 70 | 0 | 131 |
| | | ACP | WR | ddr3 | random, 4KB | 8 | 60 | 0 | 152 |

| Testcase | Description | Port | Operation | Addr_Start | Addr_Nxt | Beats /tranx | Tranx int. | AXI:qos | Est. Thoughput (MB/sec) |
|---|---|---|---|---|---|---|---|---|---|
| PS+HP | Example Scenario Traffic | HP0 | RD | ddr0 | increment | 16 | 48 | 0 | 381 |
| | | HP1 | WR | ddr1 | increment | 16 | 48 | 0 | 381 |
| | | HP2 | RD | ddr2 | increment | 16 | 48 | 0 | 381 |
| | | HP3 | WR | ddr3 | increment | 16 | 48 | 0 | 381 |

PERFORMANCE ANALYSIS USING CONFIGURABLE HARDWARE EMULATION WITHIN AN INTEGRATED CIRCUIT

TECHNICAL FIELD

This disclosure relates to integrated circuits (ICs) and, more particularly, to performance analysis using configurable hardware emulation within an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Modern programmable ICs are capable of implementing complex system architectures. An example of a complex system architecture, sometimes called a system-on-chip (SOC), is an IC that includes a processor configured to execute user program code interacting with one or more circuit blocks sometimes referred to as Intellectual Property (IP) circuit blocks. The circuit blocks may be implemented within programmable circuitry of the IC. Building a final system using such a complex device is difficult and time consuming. In consequence, performance estimation tools are highly desirable to help one determine the suitability of a given IC architecture for a particular application.

Available performance estimation tools for programmable ICs and, in particular, SOCs, however, are largely inadequate for evaluating the suitability of complex system architectures for a particular application. Those performance estimation tools that are available tend to be software-centric. While performance estimation tools may be developed that extend to hardware aspects of an SOC, the effort required for performance analysis of an arbitrary, complex system is significant and requires a large amount of domain specific knowledge. A further complication is that one attempting to implement performance estimation for an SOC may lack the rights to use one or more IP cores needed for system implementation.

SUMMARY

A system includes a host data processing system and a target platform coupled to the host data processing system. The target platform includes an emulation system. The emulation system includes a processor system, an emulation circuit coupled to the processor system through an integrated circuit (IC) interconnect, and a performance monitor coupled to the IC interconnect. The emulation system receives, from the host data processing system, a software emulation model and a data traffic pattern. The emulation system emulates a system architecture by executing the software emulation model within the processor system and implementing the data traffic pattern over the IC interconnect using the emulation circuit. The emulation system provides, to the host data processing system, measurement data collected by the performance monitor during the emulation.

A method includes receiving, within a host data processing system, user selection of a data traffic pattern and receiving, within the host data processing system, a user selection of a software emulation model. The method includes sending the data traffic pattern and the software emulation model from the host data processing system to a target platform having an IC including a processor system coupled to an emulation circuit. The method also may include emulating a system architecture by executing the software emulation model using the processor system and implementing the data traffic pattern using the emulation circuit. Measurement data is collected from emulating the system architecture and is provided from the IC to the host data processing system.

BRIEF DESCRIPTION OF THE DRAWINGS

FIG. 7 is a view of an exemplary user interface that receives runtime configuration data.

FIG. 10 is another exemplary user interface illustrating a predefined data traffic pattern.

FIG. 11 is another exemplary user interface illustrating another predefined data traffic pattern.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to performance analysis using configurable hardware emulation within an IC. In accordance with the inventive arrangements described within this disclosure, an emulation environment is disclosed that allows a user to perform performance analysis on various system designs and/or system architectures prior to performing design work. The emulation environment may include a host data processing system coupled to a target platform. The target platform includes an IC having an emulation system implemented therein.

Using the host data processing system, a user may specify one or more aspects of an emulation scenario. The emulation scenario is sent from the host data processing system to the target platform and loaded into the emulation system. The emulation system may implement the emulation scenario under control of the host data processing system. Measurement data collected within the IC may be sent to the host data processing system for evaluation.

One or more aspects of the inventive arrangements disclosed herein may be implemented as a system that includes a data processing system, e.g., a computer, in communication with a programmable IC. One or more aspects of the inventive arrangements described within this disclosure also may be implemented as a method or process performed by, or within, a system such as an emulation environment. Further aspects may be implemented as a computer readable storage medium storing program code that, when executed by a processor, causes the processor to perform a method or process.

For purposes of simplicity and clarity of illustration, elements shown in the figures are not necessarily drawn to scale. For example, the dimensions of some of the elements may be exaggerated relative to other elements for clarity. Further, where considered appropriate, reference numbers are repeated among the figures to indicate corresponding, analogous, or like features.

Figure 1:
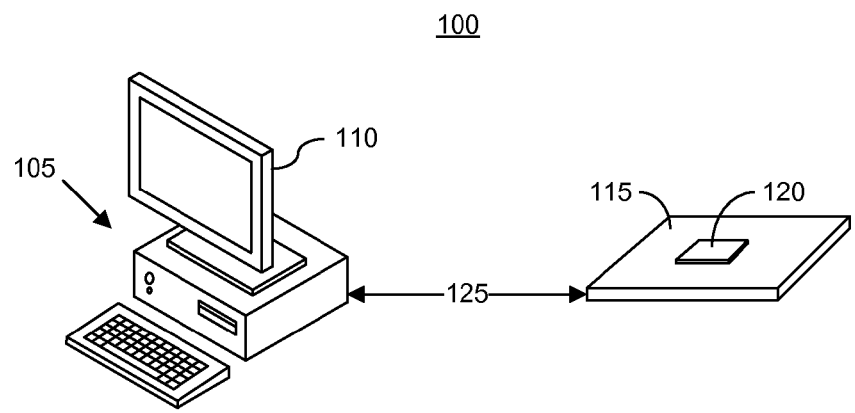
FIG. 1 is a block diagram illustrating an exemplary emulation environment.

FIG. 1 is a block diagram illustrating an exemplary emulation environment 100. As pictured, emulation environment 100 includes a host data processing system 105 having a display device 110. Host data processing system 105, for example, may be implemented as a computer system or the like. Host data processing system 105 is coupled to a target platform 115 through a communication link 125.

Target platform 115 may be implemented as a circuit board such as a printed circuit board having circuitry implemented thereon. Target platform 115 may include a connector that couples to communication link 125. The connector may be coupled, using circuitry of target platform 115, to a socket, receptacle, or other housing that physically and electrically couples IC 120 to target platform 115. In another aspect, IC 120 may be physically and electrically coupled to target platform 115 without a socket, receptacle, or housing. In either case, IC 120 couples to communication link 125 through target platform 115. In one aspect, IC 120 is a programmable IC. In another aspect, IC 120 is a system-on-chip (SOC). IC 120 implements an emulation system that operates under control of host data processing system 105.

As noted, host data processing system 105 is coupled to target platform 115 through communication link 125. Communication link 125 may be implemented as any of a variety of different wired and/or wireless connections. Exemplary wired implementations of communication link 125 include, but are not limited to, point-to-point Ethernet, Universal Serial Bus (USB), FireWire (IEEE 1394 interface), or the like. Exemplary wireless implementations of communication link 125 include, but are not limited to, Bluetooth®, Wi-Fi®, or the like. In the case of a wireless implementation of communication link 125, the connector of target platform 115 may be implemented as a wireless transceiver. The exemplary communication links noted within this disclosure are provided for purposes of illustration and not intended as limitations.

In operation, a user defines an emulation scenario using host data processing system 105. The emulation scenario is sent from host data processing system 105 over communication link 125 to an emulation system implemented within IC 120. The emulation scenario is implemented within, or using, the emulation system within IC 120. Measurement data is collected during the emulation within IC 120. The measurement data may be sent from IC 120 over communication link 125 to host data processing system 105 for analysis and/or evaluation.

Figure 2:
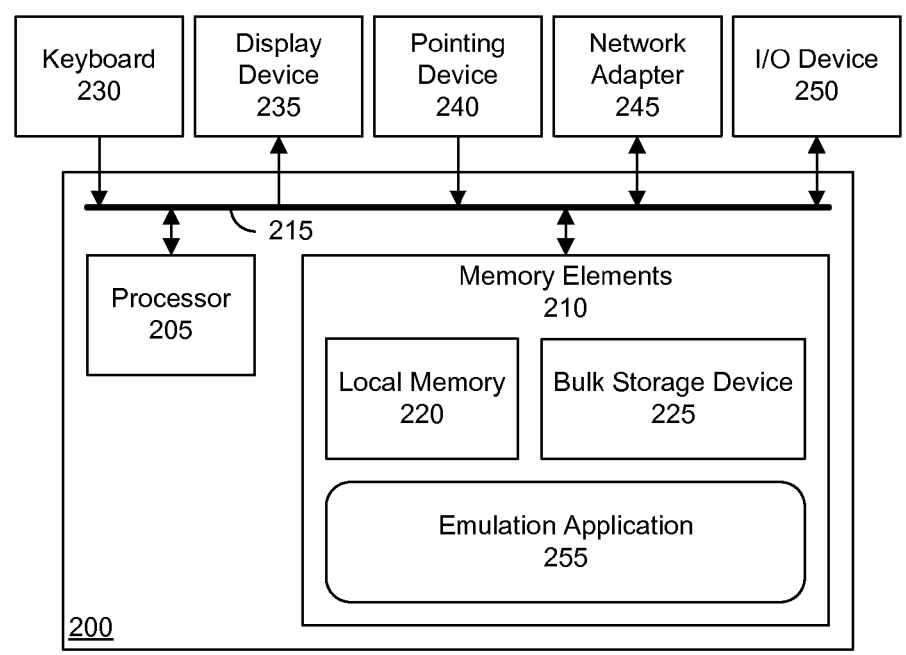
FIG. 2 is a block diagram illustrating an exemplary architecture for the host data processing system of FIG. 1.

FIG. 2 is a block diagram illustrating an exemplary architecture 200 for host data processing system 105 of FIG. 1. Architecture 200 includes at least one processor, e.g., a central processing unit (CPU), 205 coupled to memory elements 210 through a system bus 215 or other suitable circuitry. Architecture 200 stores program code within memory elements 210. Processor 205 executes the program code accessed from memory elements 210 via system bus 215. In one aspect, architecture 200 may be used to implement a computer or other data processing system that is suitable for storing and/or executing program code. It should be appreciated, however, that architecture 200 may be used to implement any system including a processor and memory that is capable of performing the functions described within this disclosure.

Memory elements 210 include one or more physical memory devices such as, for example, a local memory 220 and one or more bulk storage devices 225. Local memory 220 may be implemented as a random access memory (RAM) or other non-persistent memory device(s) generally used during actual execution of the program code. Bulk storage device 225 may be implemented as a hard disk drive (HDD), solid state drive (SSD), or other persistent data storage device. Architecture 200 also may include one or more cache memories (not shown) that provide temporary storage of at least some program code in order to reduce the number of times program code must be retrieved from the bulk storage device during execution.

Input/output (I/O) devices such as a keyboard 230, a display device 235, and a pointing device 240 optionally can be coupled to architecture 200. The I/O devices can be coupled to architecture 200 either directly or through intervening I/O controllers. A network adapter 245 also can be coupled to architecture 200 to enable a system implemented using architecture 200 to become coupled to other systems, computer systems, remote printers, remote storage devices, and/or target platform 115 of FIG. 1 through intervening private or public networks. Modems, cable modems, Ethernet cards, and wireless transceivers are examples of different types of network adapter 245 that can be used with architecture 200. An input/output (I/O) device 250 such as a USB port, a FireWire port, or the like also may be coupled to architecture 200 to allow a system implemented using architecture 200 to become coupled to another system such as any of the aforementioned systems including target platform 115 of FIG. 1.

As pictured in FIG. 2, memory elements 210 stores an emulation application 255. In one aspect, emulation application 255 may include a plurality of different components or modules (not shown). For example, emulation application 255 may include target platform support program code such as a driver for communicating with target platform 115. Emulation application 255 further may include user interface program code that, when executed, generates a user interface. Emulation application 255 further may include one or more scripts and/or other modules.

Emulation application 255, being implemented in the form of executable program code, is executed by architecture 200. As such, emulation application 255 is considered part of a system implemented using architecture 200. Architecture 200, while executing emulation application 255, communicates with target platform 115 of FIG. 1. Emulation application 255 and any data items used, generated, and/or operated upon by architecture 200 executing emulation application 255 are functional data structures that impart functionality when employed as part of architecture 200. Any data items used, generated, or operated upon by an emulation system within an IC, e.g., data items of an emulation scenario, are functional data structures that impart functionality when employed as part of the emulation system of the IC.

Figure 3:
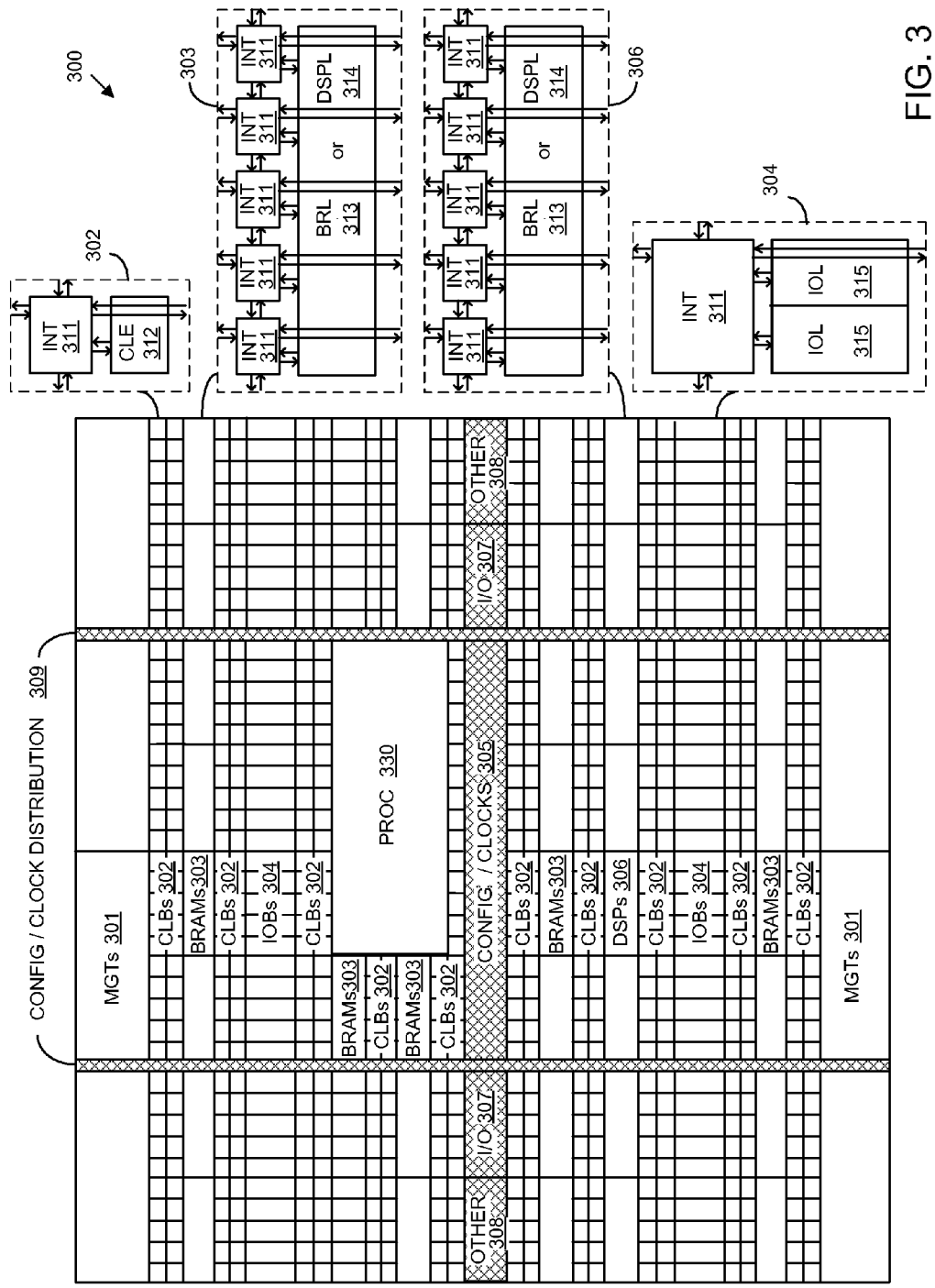
FIG. 3 is a block diagram illustrating an exemplary architecture for an integrated circuit (IC).

FIG. 3 is a block diagram illustrating an exemplary architecture 300 for an IC. For example, architecture 300 may be used to implement IC 120 of FIG. 1. In one aspect, architecture 300 is implemented within a field programmable gate array (FPGA) type of IC.

As shown, architecture 300 includes several different types of programmable circuit, e.g., logic, blocks. For example, architecture 300 can include a large number of different programmable tiles including multi-gigabit transceivers (MGTs) 301, configurable logic blocks (CLBs) 302, random access memory blocks (BRAMs) 303, input/output blocks (IOBs) 304, configuration and clocking logic (CONFIG/CLOCKS) 305, digital signal processing blocks (DSPs) 306, specialized I/O blocks 307 (e.g., configuration ports and clock ports), and other programmable logic 308 such as digital clock managers, analog-to-digital converters, system monitoring logic, and so forth.

In some ICs, each programmable tile includes a programmable interconnect element (INT) 311 having standardized connections to and from a corresponding INT 311 in each adjacent tile. Therefore, INTs 311, taken together, implement the programmable interconnect structure for the illustrated IC. Each INT 311 also includes the connections to and from the programmable logic element within the same tile, as shown by the examples included at the top of FIG. 3.

For example, a CLB 302 can include a configurable logic element (CLE) 312 that can be programmed to implement user logic plus a single INT 311. A BRAM 303 can include a BRAM logic element (BRL) 313 in addition to one or more INTs 311. Typically, the number of INTs 311 included in a tile depends on the height of the tile. As pictured, a BRAM tile has the same height as five CLBs, but other numbers (e.g., four) also can be used. A DSP tile 306 can include a DSP logic element (DSPL) 314 in addition to an appropriate number of INTs 311. An 1OB 304 can include, for example, two instances of an I/O logic element (IOL) 315 in addition to one instance of an INT 311. As will be clear to those of skill in the art, the actual I/O pads connected, for example, to IOL 315 typically are not confined to the area of IOL 315.

In the example pictured in FIG. 3, a columnar area near the center of the die, e.g., formed of regions 305, 307, and 308, can be used for configuration, clock, and other control logic. Horizontal areas 309 extending from this column are used to distribute the clocks and configuration signals across the breadth of the programmable IC.

Some ICs utilizing the architecture illustrated in FIG. 3 include additional logic blocks that disrupt the regular columnar structure making up a large part of the IC. The additional logic blocks can be programmable blocks and/or dedicated circuitry. For example, a processor block depicted as PROC 310 spans several columns of CLBs and BRAMs.

In one aspect, PROC 310 is implemented as a dedicated circuitry, e.g., as a hard-wired processor, that is fabricated as part of the die that implements the programmable circuitry of the IC. PROC 310 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 310 is omitted from architecture 300 and replaced with one or more of the other varieties of the programmable blocks described. Further, such blocks can be utilized to form a "soft processor" in that the various blocks of programmable circuitry can be used to form a processor that can execute program code as is the case with PROC 310.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 3 that are external to PROC 310 such as CLBs 302 and BRAMs 303 can be considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks that is otherwise non-existent.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 310.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 3 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 3 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 310 within the IC are for purposes of illustration only and are not intended as a limitation.

Figure 4:
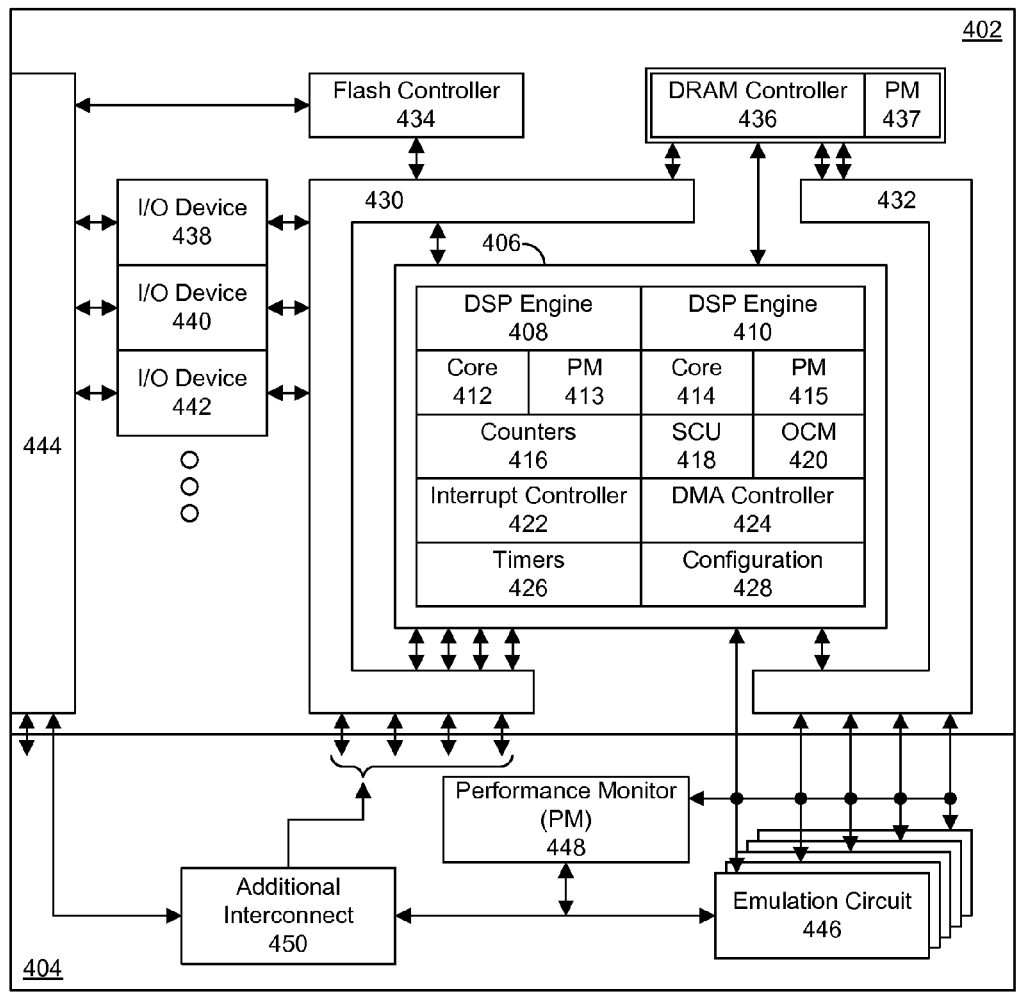
FIG. 4 is a block diagram illustrating an exemplary implementation of an emulation system.

FIG. 4 is a block diagram illustrating an exemplary emulation system 400. Emulation system 400 may be implemented within IC 120. In one aspect, emulation system 400 may be preloaded into the FPGA for operation and use with host data processing system 105. In another aspect, emulation system 400 may be stored within host data processing system 105 and automatically loaded into IC 120 by host data processing system 105 without the user having to create a circuit design implementing emulation system 400.

Emulation system 400 includes a processor system 402 and programmable circuitry 404. Processor system 402 is hardwired. As such, the various elements pictured within processor system 402 exist within IC 120 without first having to load configuration data, i.e., a configuration bitstream. By comparison, programmable circuitry 404 is not hardwired. Programmable circuitry 404, as described herein, includes one or more programmable circuit blocks or tiles that are configured to form particular circuit structures and/or systems that perform particular operations and/or functions only after configuration data is loaded.

Processor system 402 includes a processor complex 406, also referred to as a processor. In the example shown, processor complex 406 includes two cores. It should be appreciated, however, that processor complex 406 may be a single core processor or include more than two cores. Processor complex 406 includes DSP engines 408 and 410, cores 412 and 414, performance monitors 413 and 415, counters 416, a snoop control unit (SCU) 418, and an on-chip memory (OCM) 420. Processor complex 406 also includes an interrupt controller 422, a direct memory access (DMA) controller 424, timers 426, and configuration block 428 including one or more configuration registers.

Each of performance monitors 413 and 415 is implemented as circuitry including a plurality of counters that count the occurrence of selected events within PS 402. For example, each of performance monitors 413 and 415 may be configured, through associated control registers, to count any of a plurality of different events occurring within core complex 406. Examples of different events that may be detected and counted include, but are not limited to, execution of Java bytecode, external interrupts, instruction cache dependent stall cycles, data cache dependent stall cycles, reaching a particular program counter value, and the like. Data collected by performance monitors 413 and 415 may be sent to the host data processing system for evaluation and/or further processing. In one aspect, performance monitor 413 and performance monitor 415 may be implemented as a Performance Monitoring Unit as included within the Cortex®-A series of processors, e.g., the Cortex®-A9, available from ARM Inc.

Core complex 406 is communicatively linked with other elements within processor system 402 through on-chip interconnects 430 and 432. One example of an interconnect structure that may be used to implement interconnects 430 and/or 432 is the Advanced Microcontroller Bus Architecture (AMBA®) Interconnect available from ARM Inc. Interconnects 430 and 432 provide on-chip connection and management of functional blocks in a system-on-chip.

Interconnect 430 couples core complex 406 to a flash controller 434, DRAM controller 436 and associated performance monitor 437, and one or more I/O devices 438, 440, and 442. Interconnect 430 further provides communication links into programmable circuitry 404 that couple various circuits and/or systems that may be implemented within programmable circuitry 404 to core complex 406. Interconnect 432 couples core complex 406 to DRAM controller 436 and associated performance monitor 437. Interconnect 432 also couples core complex 406 to a plurality of emulation circuits 446 within programmable circuitry 404. As shown, DRAM controller 436 also is directly coupled to core complex 406. Similarly, one or more of emulation circuits 446 may directly couple to core complex 406.

Performance monitor 437 may include a plurality of counters that count the occurrence of selected events within DRAM controller 436. Data collected by performance monitor 437 may be sent to the host data processing system by core complex 406 for evaluation and/or further processing.

I/O devices 438, 440, and 442 are representative of a plurality of different types of I/O devices, e.g., peripherals, that may be included within processor system 402. Processor system 402 may include more or fewer I/O devices than shown. Exemplary I/O devices represented by I/O devices 438, 440, and 442 may include, but are not limited to, one or more of a Serial Peripheral Interface (SPI) bus, an Inter-Integrated Circuit (I²C) bus, a Controller Area Network (CAN) bus, a Universal Asynchronous Receiver/Transmitter (UART), a General Purpose Input/Output (GPIO), a Secure Digital Input Output (SDIO) with DMA, a USB with DMA, a gigabit Ethernet (GigE) with DMA, or the like.

I/O devices 438, 440, and 442 are coupled to an I/O multiplexer 444. I/O multiplexer 444 receives signals from I/O devices 438, 440, and 442, and from flash controller 434, and selectively routes the signals to I/O pins of the IC and/or into programmable circuitry 404. Similarly, I/O multiplexer 444 may selectively route signals from I/O pins of the IC into programmable circuitry 404 and/or into one or more of I/O devices 438, 440, and/or 442, and/or flash controller 434.

Programmable circuitry 404 includes a plurality of emulation circuits 446, performance monitor 448, and additional interconnect block 450. Additional interconnect block 450 represents hardwired interconnects implemented within programmable circuitry 404 that allow circuit blocks and/or systems implemented within programmable circuitry 404 to couple to processor system 402. In this regard, though shown within programmable circuitry 404, additional interconnect block 450 is circuitry that crosses a boundary between programmable circuitry 404 and processor system 402.

Emulation circuits 446 and performance monitor 448 are circuit blocks implemented within programmable circuitry 404 responsive to the loading of configuration data such as a bitstream. In one aspect, each of emulation circuits 446 is implemented as a configurable data traffic generator. Each of emulation circuits 446 may generate data, send data to processor system 402, and/or receive data from processor system 402. The amount of data generated, the frequency of the data, and the like are configurable. Once emulation circuits 446 are formed by loading configuration data, each of emulation circuits 446 may receive instructions from processor system 402 specifying a particular data traffic pattern that one or more or all of the emulation circuits 446 are to generate. In another aspect, each of emulation circuits 446 may receive instructions from the host system through I/O 444 specifying a particular data traffic pattern that one or more or all of the emulation circuits 446 are to implement or execute. It should be appreciated, that each emulation circuit 446 may implement a data traffic pattern that is selected independently of the data traffic pattern selected for each other emulation circuit 446.

In one aspect, each of emulation circuits 446 can be implemented as similar or identical circuits. Each of emulation circuits 446 can include a first communication port (not shown) that is coupled to processor system 402. Each of emulation circuits 446 can include a second port that is also coupled to processor system 402. Accordingly, processor system 402 may have two independent interfaces to each of emulation circuits 446.

One port of each emulation circuit 446 may be reserved for receiving data traffic patterns and/or other instructions from processor system 402. In implementations where emulation circuits 446 are controlled by the host data processing system via I/O multiplexer 444, the port reserved for receiving data traffic patterns and/or other instructions may be coupled to I/O multiplexer 444 via additional interconnect 450.

The other port of each emulation circuit 446 may be used for sending actual data traffic generated from implementing a data traffic pattern and/or for receiving data traffic from another source. Thus, it should be appreciated that a data traffic pattern is to be distinguished from the data traffic, or data, that is generated by implementing the data traffic pattern or the data that is received by the emulation circuit(s) 446. A data traffic pattern refers to the instructions implemented by emulation circuits 446 that result in the generation of data or data traffic.

Processor system 402 may send data traffic patterns to the emulation circuits 446 through the reserved port. In one aspect, each of emulation circuits 446 can be programmed to mimic the behavior of a particular IP block and/or function. Accordingly, each of emulation circuits 446 may emulate, or model, any of a variety of different data traffic scenarios expected to be generated or consumed by a hardware block such as a video codec, a particular DSP unit, or the like. In this regard, each emulation circuit 446 may write data, e.g., generate data traffic, and consume or read data traffic, e.g., receive traffic, that would be characteristic of the particular IP block modeled by the emulation circuit 446.

For example, a data traffic pattern provided to an emulation circuit 446 may specify one or more commands for moving data between processor system 402 and the emulation circuit 446. The various commands can include read commands, write commands, or a combination of read and write commands. Each respective read and/or write command can specify an amount of data that is to be read or written. Each read and/or write command also can specify a "delay" parameter that indicates the amount of time to wait before emulation circuit 446 is to implement the command after the prior command executes (e.g., after the prior transaction completes). In addition, each of emulation circuits 446 can be configured to implement a repeat, e.g., loop, mode. In the repeat mode, the same sequence of commands can be repeated for a particular number of times as specified by the data traffic pattern provided to emulation circuit 446.

In one example, the data traffic patterns allow emulation circuits 446 to emulate a circuit block that is polled by processor complex 406. In another example, the data traffic pattern may cause an emulation circuit 446 to emulate a circuit block that is interrupt driven, or the like. The data traffic pattern may cause the emulation circuits 446 to mimic various types of data transfers, including, DMA transfers, create dependencies among individual ones of emulation circuits 446, and/or create dependencies between one or more other emulation circuits 446 and/or processor system 402.

In one example, each of emulation circuits 446 may be implemented as a LogiCORE™ IP AXI Traffic Generator (Traffic Generator) available from Xilinx, Inc. of San Jose, Calif. In general, each Traffic Generator is configurable to generate and accept data according to different traffic profiles, supports dependent/independent transactions between read/write master port with configurable delays, is programmable to repeat count for each transaction with constant, increment, or random addressing, externally controllable to start and stop traffic generation with or without processor intervention, and generate IP-specific traffic without processor intervention.

Performance monitor 448 is coupled to the signal lines, e.g., interconnects, between emulation circuits 446 and processor system 402 as well as the signal lines between emulation circuits 446 and additional interconnect block 450. Performance monitor 448 monitors the data traffic implemented on the various signal lines connecting emulation circuits 446 with processor system 402, whether the signal lines are direct connections between emulation circuits 446, traverse through interconnect 430 and/or 432, and/or traverse through additional interconnect block 450. Performance monitor 448 may determine various parameters or values passing on the signal lines during emulation. Performance monitor 448, for example, identifies or detects information on the various signal lines shown such as timestamps of start and end times, address information, or the like. In one aspect, the additional interconnects may be implemented as AXI Interconnects and/or AXI Lite Interconnects.

Performance monitor 448 may store collected measurement data within memory of programmable circuitry 404. Core complex 406 may access the stored measurement data and send the measurement data to the host data processing system for evaluation and/or further processing.

In one example, performance monitor 448 may be implemented as one or more LogiCORE IP AXI Performance Monitors (AXI Performance Monitor) available from Xilinx Inc. The AXI Performance Monitor enables AXI system performance measurement for multiple slots, e.g., AXI4, AXI3, AXI4-Stream, and AXI4-Lite. The AXI Performance Monitor may capture real-time performance metrics for throughput and latency for connected AXI interfaces. The AXI Performance Monitor can log AXI transactions, external system events, and perform real-time profiling for software applications.

Figure 5:
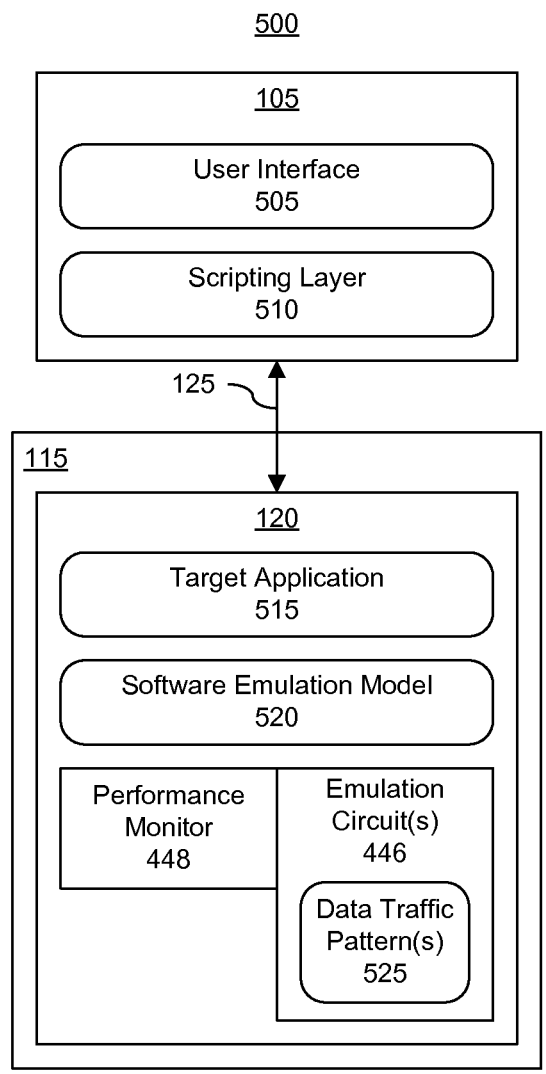
FIG. 5 is a block diagram illustrating an exemplary software architecture for the emulation environment of FIG. 1.

FIG. 5 is a block diagram illustrating an exemplary software architecture 500 for emulation environment 105 of FIG. 1. Within FIG. 5, hardware is illustrated using rectangular blocks, while software is represented using blocks with rounded edges. As pictured, host data processing system 105 includes a user interface 505 and a scripting layer 510. In one aspect, the emulation application 255 of FIG. 2 may be implemented using the software architecture pictured within host data processing system 105.

User interface 505 may be implemented using any of a variety of program code technologies. In one aspect, user interface 505 may be implemented using an existing application that is scriptable. For example, user interface 505 may be implemented as a scriptable spreadsheet application. In this regard, scripting layer 510 may be implemented as one or more scripts that may execute cooperatively with user interface 505. In another aspect, scripting layer 510 may be implemented as one or more scripts that are included, or embedded, within user interface 505.

For example, scripting layer 510 receives data such as one or more user inputs, from user interface 505. Scripting layer 510 may process the received data, format the received data, and send the data to IC 120. Scripting layer 510 further may receive measurement data from IC 120, process the measurement data, format the measurement data, and provide the measurement data to user interface 505 for presentation to a user.

Target platform 115 includes IC 120. IC 120 executes a target application 515 within the processor system. The processor system of IC 120 further executes a user selected, or user provided, software emulation model 520. Emulation circuits 446 implement data traffic pattern(s) 525. In one example, host data processing system 105 provides software emulation model 520 and data traffic pattern(s) 525 to target platform 115 as part of an emulation scenario.

Host data processing system 105 communicates with target platform 115 over communication link 125. Over communication link 125, host data processing system 105 provides an emulation scenario, instructions to run, e.g., start, stop, etc., and further receives measurement data generated by the emulation system implemented within IC 120.

In one aspect, target application 515 is implemented within IC 120 as part of the configuration data, or configuration bitstream, that implements the emulation system therein. Target application 515 is preconfigured as part of the emulation system. For example, when executed by the processor system of IC 120, target application 515 sends data traffic pattern(s) 525 to the various emulation circuits 446. Further, target application 515 invokes software emulation model 520, which is then executed within the processor system of IC 120. Target application 515 further configures performance monitor 448 and other performance monitors located in the processor system in accordance with any user specified parameters included within the emulation scenario received from host data processing system 105.

In another aspect, one or more of the operations described and attributed to target application 515 may be performed by host data processing system 105. For example, scripting layer 510, executing within host data processing system 105, may act as master and initiate operations within IC 115 including, but not limited to, invoking software emulation model 520, providing traffic patterns to emulation circuits 446, starting or invoking and/or stopping emulation circuits 446, interfacing with performance monitor 448 and/or other performance monitors located in the processor system, or the like.

Figure 6:
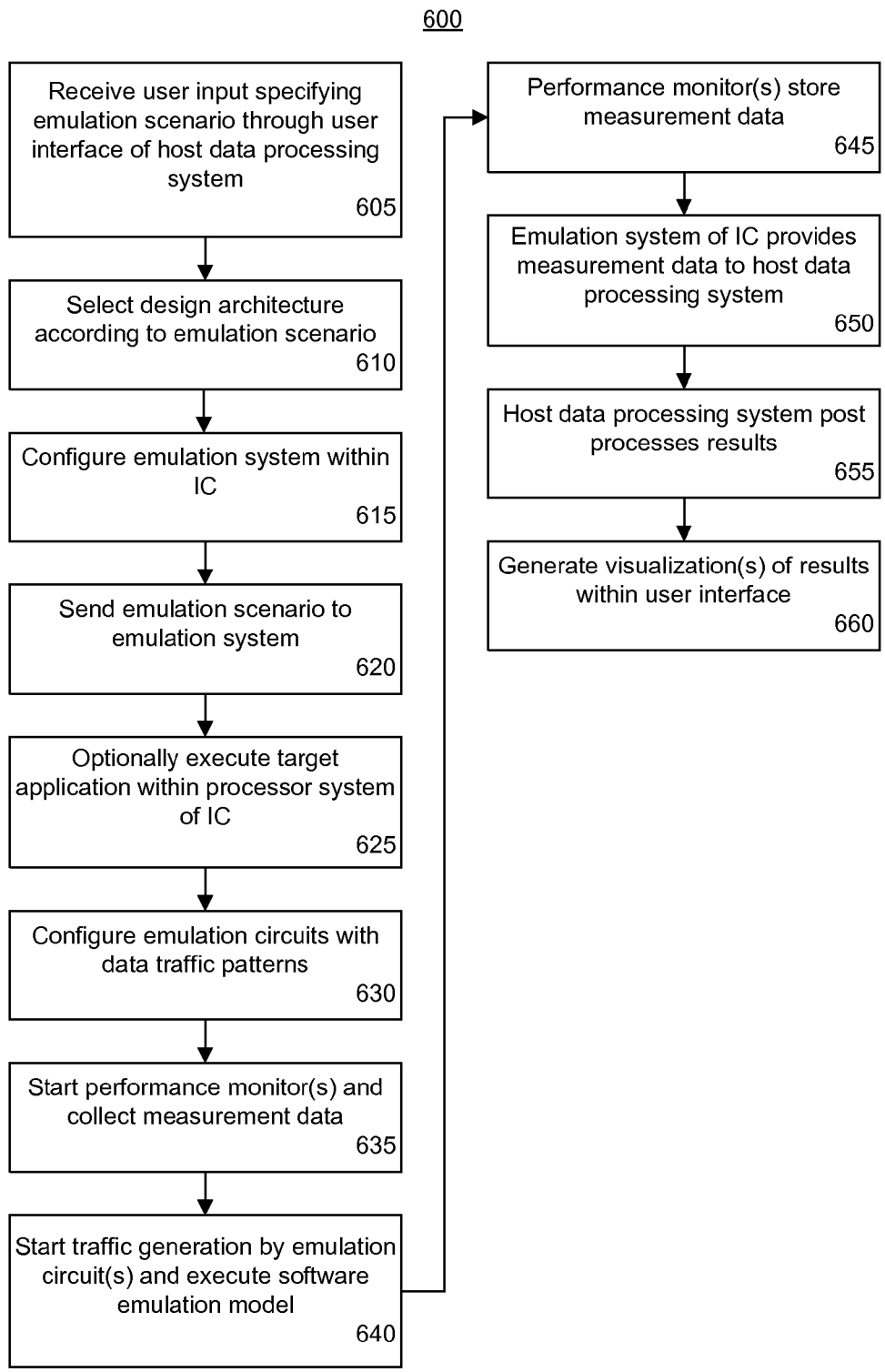
FIG. 6 is a flow chart illustrating an exemplary method of performing emulation using the emulation environment of FIG. 1.

FIG. 6 is a flow chart illustrating an exemplary method 600 of performing emulation using an emulation environment as described with reference to FIG. 1. Method 600 can begin in block 605, where the host data processing system receives one or more user inputs specifying an emulation scenario through the user interface executing therein. For example, through the user interface, a user may specify an emulation scenario by providing a user input selecting one or more data traffic patterns for implementation. Through the user interface, the user may specify a software emulation model that is to be executed within the processor system of the IC. Through the user interface, the user further may specify one or more settings for one or more or all of the various performance monitors of the IC. In one aspect, in addition to monitoring for various transactions and/or events detected on the interconnects, the user may specify whether power monitoring is activated for the performance monitor during the emulation.

In still another aspect, a user may specify one or more runtime configuration settings that may be used for the emulation system. For example, the user may specify clock frequencies for the processor system, clock frequencies for the programmable circuitry, DDR path widths, DDR clock frequency, and other parameters that may be incorporated into the emulation system.

In block 610, the system architecture that is to be emulated is selected by the host data processing system based upon user input received in block 605. For example, having received user input describing the emulation scenario, the host data processing system generates the emulation scenario by including the particular data traffic patterns indicated by the user, the software emulation model, and/or any performance monitor settings within one or more test files that collectively form the emulation scenario to be sent to the emulation system within the IC.

In block 615, the host data processing system configures the emulation system within the IC. For example, the host data processing system sends configuration data specifying the emulation system to the target platform. The configuration data is loaded into the IC of the target platform, thereby implementing the emulation system therein. As previously discussed, in one aspect, the target application executed within the processor system of the IC is sent to the IC as part of the configuration data in block 615.

Any runtime configuration settings specified by the user further may be incorporated into the emulation system. For example, the host data processing system may incorporate operating frequencies, data widths, and the like, as specified by the user, into the configuration data for the emulation system prior to sending the configuration data to the IC. In one aspect, implementation of the emulation system within the IC is performed automatically without the user having to be familiar with circuit design for a programmable IC. For example, responsive to the user selecting a control such as "start emulation," the host data processing system can perform the operations described within block 615 without further user intervention. While the user may select various data items of the emulation scenario, the emulation system architecture, e.g., as illustrated in FIG. 4, is preconfigured. As such, the user does not undertake any circuit design or even require knowledge of how to design systems within the IC in order to implement the emulation system within the IC and emulate system performance.

In block 620, the host data processing system sends the emulation scenario to the emulation system. In block 625, the target application optionally executes within the processor system of the IC. In block 630, the emulation circuits are configured with the specified data traffic patterns provided as part of the emulation scenario. As discussed, each emulation circuit may be independently configured with a particular data traffic pattern. In one aspect, the processor system, through execution of the target application, sends the appropriate data traffic pattern to the reserved port of each emulation circuit in accordance with the emulation scenario. In another aspect, the host system, through execution of the scripting layer, may send the appropriate data traffic pattern to the reserved port of each emulation circuit, for example, via I/O multiplexer 444 of FIG. 4.

In block 635, the performance monitors are started. In one aspect, the target application starts the performance monitors, whether the performance monitors are located within the programmable circuitry and/or in the processor system. In another aspect, the host data processing system starts the performance monitors whether the performance monitors are located in the processor system and/or in the programmable circuitry. The performance monitors begin generating measurement data by detecting and/or measuring the various performance parameters described herein.

In block 640, traffic generation by the emulation circuits is started; and, the software emulation model is executed in the processor system. In one aspect, the target application executing in the processor system invokes execution of the software emulation model and traffic generation by the emulation circuits. In another aspect, the host data processing system invokes execution of the software emulation model and traffic generation by the emulation circuits. Each emulation circuit executes, or implements, the particular data traffic pattern provided thereto. During emulation, the processor system executes the software emulation model; and, the emulation circuits execute the data traffic patterns.

In one aspect, neither the processor system nor the emulation circuits are performing actual system functions. Rather, each is generating "dummy" data, sending the dummy data, receiving the dummy data in a manner that mimics a desired behavior and power consumption so that the system, as a whole, may be evaluated. As defined within this specification, "dummy data" refers to benign or harmless data. Dummy data is meaningless data that serves as a placeholder for testing purposes. Dummy data, for example, may be randomly generated, include repeating patterns, etc.

In another aspect, however, the processor system may execute actual system program code that uses and/or generates real data as opposed to dummy data. Since the emulation circuits do not actually operate upon the content of the data received from the processor system, the emulation circuits will operate as described whether the processor system sends dummy data or real data.

In some cases, the emulation circuits utilize dummy addresses. For example, addresses may be generated as sequential values or random values according to user preference which may be used to mimic a particular application if desired. In other cases, however, the emulation circuits may use actual addresses.

In block 645, the performance monitors stores measurement data within the IC. The measurement data may include transactional information, timing, latency, detected signaling events, and/or the like. As noted, the measurement data may be collected from the processor system, from the programmable circuitry (e.g., the emulation circuits), or from both the processor system and the programmable circuitry. The measurement data also may include power measurements or estimates in accordance with the received power monitor settings in the emulation scenario.

In another aspect, the performance monitors may be used for cross-triggering purposes. For example, responsive to detecting a particular event in a performance monitor within the core complex such as reaching a particular location within program code executed by the core complex, the performance monitor may trigger an action or operation in another performance monitor and/or in one or more emulation circuits. Similarly, detection of a particular event by the performance monitor in the programmable circuitry may cause that performance monitor to trigger an action or operation by a performance monitor in the processor system and/or an action or operation by another, different emulation circuit.

In block 650, the measurement data is provided from the emulation system of the IC to the host data processing system. The emulation system sends or provides the measurement data to the host data processing system or the host data processing system may retrieve the measurement data. For example, in one aspect, the measurement data is sent by the emulation system responsive to a request received from the host data processing system. In another aspect, the measurement data is sent by the emulation system responsive to termination of the emulation without requiring a request from the host data processing system. In block 655, the host data processing system post processes the measurement data, or a portion thereof. In block 660, the host data processing system generates visualizations of the measurement data, e.g., the post processed measurement data and/or the raw measurement data, for presentation or display through the user interface.

FIG. 7 is a view of an exemplary user interface 700 that receives runtime configuration data. Runtime configuration data is one type of data that may be included within an emulation scenario that a user may define or otherwise specify. User interface 700 is an example of a user interface that may be generated by the host data processing system and displayed to a user to receive one or more parameters for an emulation session.

Through user interface 700, the user is informed that the target platform is "CONNECTED" in field 702. The user may specify the particular target platform to be used in field 704, the IP address of the board in field 706, the processor system (PS) clock frequency in field 708, the programmable circuitry (PC) clock frequency in field 710, the DDR clock frequency in field 712, and the DDR data path width in field 714. Additional exemplary runtime configuration parameters may be specified such as priorities for the various DDR ports in fields 716, 718, 720, and 722, and whether the DDR ports are enabled in fields 724, 726, 728, and 730. When DDR ports are enabled per fields 724, 726, 728, and 730, the DDR ports are used within the emulation.

Figure 8:
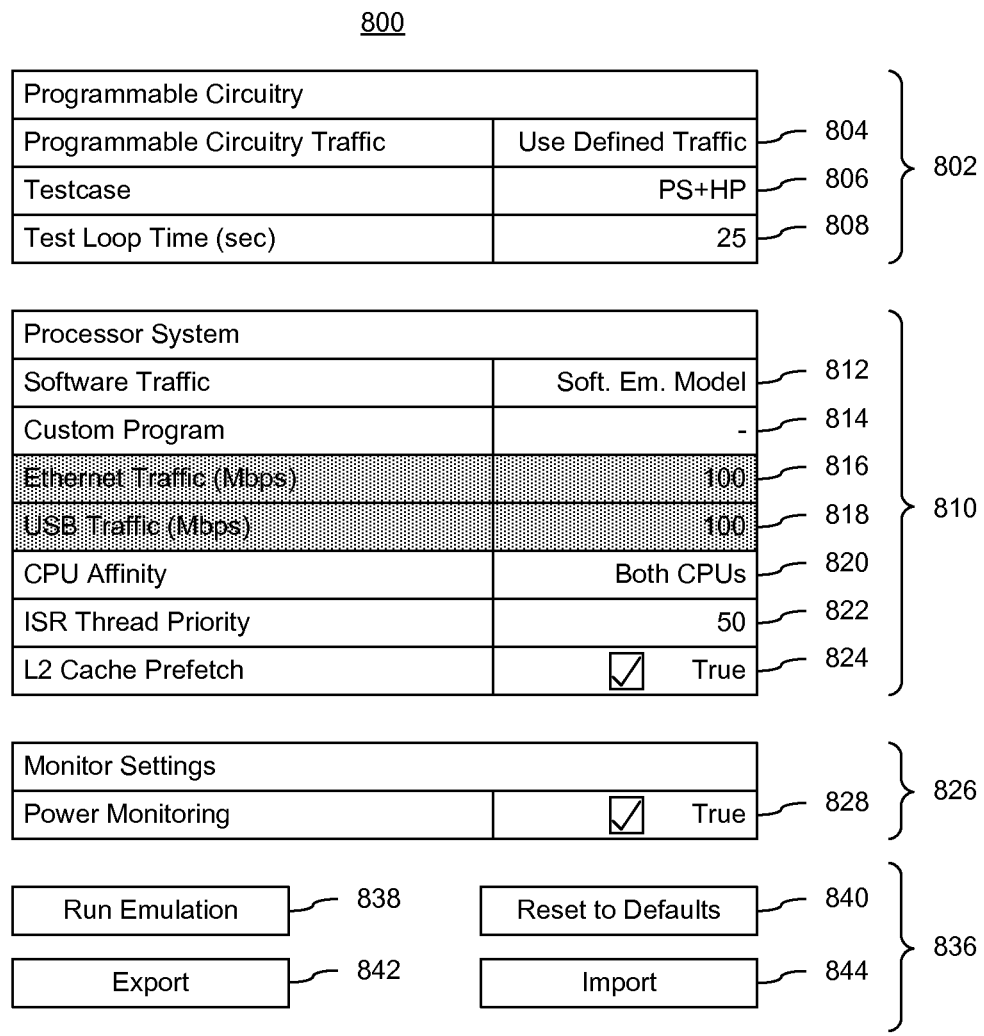
FIG. 8 is a view of another exemplary user interface that receives traffic modeling configuration data and performance monitor settings.

FIG. 8 is a view of another exemplary user interface 800 that receives traffic modeling configuration data and performance monitor settings. Traffic modeling configuration data and performance monitor settings are other types of data that may be included as part of an emulation scenario that a user may define or otherwise specify. As defined herein, "traffic modeling configuration data" means data traffic pattern(s) and a software emulation model.

In a first section 802, the user specifies traffic modeling configuration data for the programmable circuitry. More particularly, the user specifies a data traffic pattern for implementation within the emulation circuits in the programmable circuitry. In the example shown, the user has chosen to use one of the predefined data traffic patterns in field 804. In this example, the user has selected a data traffic pattern, or test case, called "PS+HP" in field 806. The user specified length of time for the emulation is 25 seconds in accordance with field 808.

In a second section 810, the user specifies traffic modeling configuration data for the processor system. More particularly, the user may select a software emulation model for the "Software Traffic" setting in field 812. The software emulation model may be any of a variety of different benchmark applications available and known in the art. One example of a software emulation model is "Imbench," which is a micro-benchmark suite. The software emulation model in this example is referred to as "software traffic" and is "Lmbench Syscall". A user also may specify a custom program as the software emulation model in field 814 in lieu of using a predefined software emulation model.

Fields 816 and 818 are inactive since the user has selected a predefined software emulation model. Accordingly, the amount of Ethernet traffic and/or USB traffic generated by the processor system is determined by the software emulation model selected as opposed to fields 816 and 818. In field 820, the user may specify whether one or both of the CPUs are to be utilized during the emulation. In field 822, the user specifies an Interrupt Service Routine (ISR) thread priority. In field 824, the user may selectively enable L2 Cache Prefetch in the processor system.

In a third section 826, the user specifies a power monitor setting for the performance monitor. The user may specify whether the performance monitor is to collect measurement data relating to power consumption in field 828.

In a fourth section 836, the user is provided with several additional controls in the form of buttons. User selection of button 838 implements the emulation specified by the various user settings input through the user interfaces of FIGS. 7 and 8. User selection of button 840 resets the various fields to default settings. User selection of button 842 exports data from the host data processing system. Selection of button 844 imports data from the emulation system in the IC into the host data processing system.

Figure 9:
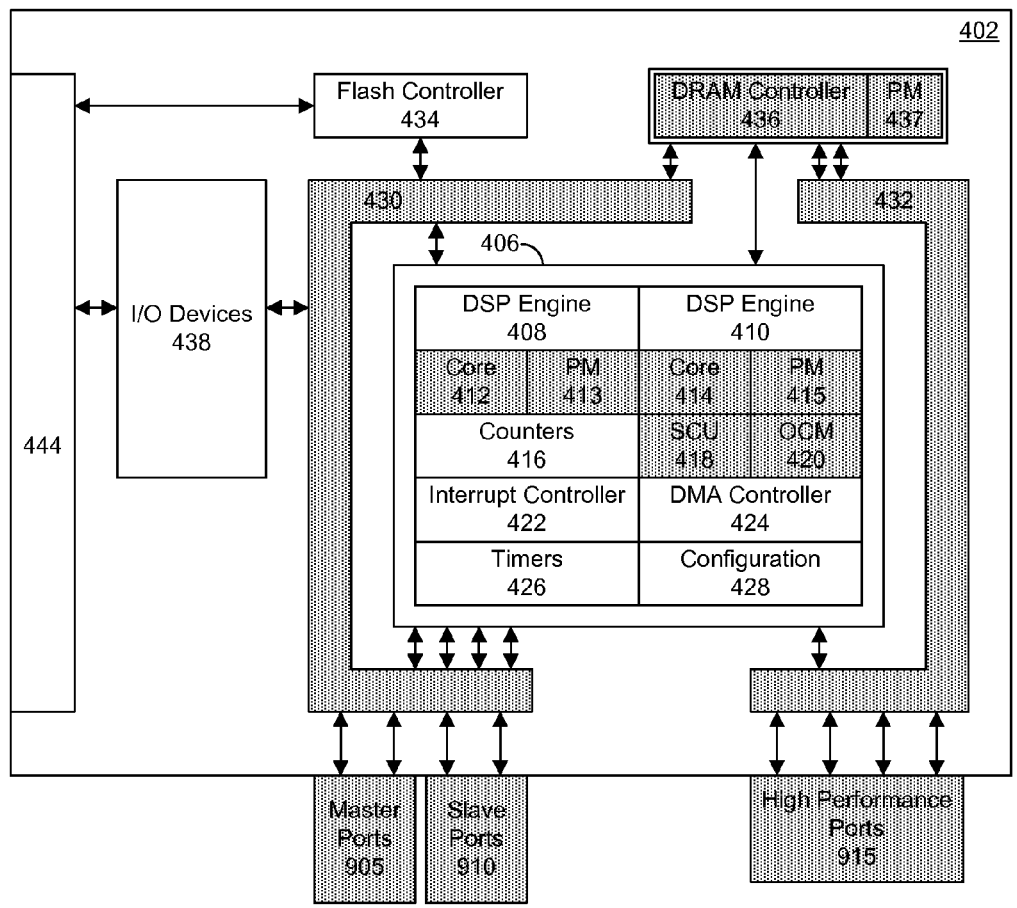
FIG. 9 is a block diagram illustrating another exemplary user interface showing a visualization of the processor system of the IC.

FIG. 9 is a block diagram illustrating an exemplary user interface 900 showing a visualization of the processor system of the IC. User interface 900 shows a simplified version of the processor system 402 described with reference to FIG. 4. Additional ports, e.g., interconnects, such as master ports 905, slave ports 910, and high performance ports 915, however, are shown. Based upon the user provided inputs described with reference to FIGS. 7 and 8, the host data processing system determines which of the various elements of the processor system, including ports 905, 910, and/or 915, are used during the emulation. In the example pictured in FIG. 9, the host data processing system visually distinguishes elements that are used during the emulation from those elements that are not. For purposes of illustration, the shaded elements are used during the emulation. Thus, interconnects 430 and 432, cores 412 and 414, performance monitors 413 and 415, SCU 418, OCM 420, ports 905, 910, and 915, DRAM controller 436, and performance monitor 437 are used during the emulation. I/O devices 438 and flash controller 434, for example, are not used.

It should be appreciated that any of a variety of different visualization techniques may be used to visually distinguish elements to be used in an emulation from elements that are not. For example, color coding, outlining, etc. may be used to visually distinguish among elements.

FIG. 10 is another exemplary user interface 1000 illustrating a predefined data traffic pattern. A data traffic pattern called "Default 0" is shown. The data traffic pattern Default 0 performs reads and writes on all ports. While FIG. 10 illustrates an example of a predefined data traffic pattern that may be available and selectable by a user through user interface 800 of FIG. 8, for example, user interface 1000 is also illustrative of the parameters that a user may provide or specify to define a custom data traffic pattern.

FIG. 11 is another exemplary user interface 1100 illustrating another predefined data traffic pattern. User interface 1100 illustrates the various settings and behavior implemented by the pre-defined data traffic pattern "PS+HP" selected in user interface 800 of FIG. 8. FIG. 11 also is illustrative of the various parameters that a user may specify in creating a custom data traffic pattern for use within an emulation.

The host data processing system further includes a variety of different user interfaces that may be used to display measurement data in various forms and/or formats. Measurement data may be output, or displayed, by the host data processing system in tabular form, as any of a variety of graphs, or the like. Measurement data from different emulation scenarios also may be displayed concurrently in tabular form or in graph form allowing a user to easily see the differences in performance between multiple, different emulation scenarios.

Examples of the various types of measurement data that may be collected, stored, and displayed include, but are not limited to, read and/or write transaction latency expressed as a minimum, a maximum, an average, standard deviation, a throughput, etc., on a per port basis in tabular or graph form. Similar or same measurement data for the processor includes, but is not limited to, which ports software (e.g., the core complex) actively used during emulation, of those ports that were used, the read and/or write latency, power consumption on a per-port basis, etc. The measurement data also may include software execution start and/or end times depending upon the particular software emulation model that is used as well as software execution run-times.

While the raw measurement data that was collected may be viewed by a user, the host data processing system may post process the data as may be required to calculate minimums, maximums, averages, standard deviation, run-times, etc. As discussed, the host data processing system, through post processing, may concurrently display multiple different test scenario results, compare raw data or other calculations from multiple different emulation scenarios, and the like.

An emulation environment is described within this disclosure that allows a designer to explore different system architectures without first having to design the system. The designer may evaluate the performance of different system architectures based upon observed interactions between a processor system executing a software emulation model and one or more emulation circuits within programmable circuitry that implement data traffic patterns. System architectures also may be evaluated based upon data traffic generated in the processor system between the core complex, e.g., the processor, and various I/O devices within the processor system in accordance with the executed software emulation model.

In performing emulation, the system designer need not have any working knowledge of programmable ICs or how to implement circuit designs within programmable ICs. The designer may specify a system architecture by accepting default settings, selecting predefined behaviors, and the like, which may be automatically implemented by the emulation system within the IC of the target platform. Emulation results are provided from the emulation system to the host data processing system for review and/or post processing. As such, a user may evaluate and compare emulation results from different system architectures and corresponding emulations to determine which meets expectations or other performance requirements.

Using the host data processing system, a user may specify one or more aspects of an emulation scenario. The emulation scenario is sent from the host data processing system to the target platform and loaded into the emulation system. The emulation system may implement the emulation scenario under control of the host data processing system. Measurement data collected within the IC may be sent to the host data processing system for evaluation.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a computer program product, which includes all the features enabling the implementation of the methods described herein. The computer program product includes a data storage medium which is a non-transitory computer-usable or computer-readable medium, storing program code that, when loaded and executed in a system including a processor, causes the system to initiate and/or perform at least a portion of the functions and/or operations described within this disclosure. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

A system includes a host data processing system and a target platform coupled to the host data processing system. The target platform includes an emulation system. The emulation system includes a processor system, an emulation circuit coupled to the processor system through an IC interconnect, and a performance monitor coupled to the IC interconnect. The emulation system receives, from the host data processing system, a software emulation model and a data traffic pattern. The emulation system emulates a system architecture by executing the software emulation model within the processor system and implementing the data traffic pattern over the IC interconnect using the emulation circuit. The emulation system provides, to the host data processing system, measurement data collected by the performance monitor during the emulation.

In one aspect, the emulation system is implemented within an IC of the target platform, and wherein the emulation system further receives, from the host data processing system, runtime configuration data for the IC. The runtime configuration data may specify a plurality of settings for a memory interface of the IC that communicates with an external memory.

The emulation system may be automatically implemented within an IC of the target platform under control of the host data processing system.

In another aspect, the data traffic pattern is selected from a plurality of pre-defined data traffic patterns stored within the host data processing system.

The host data processing system may include a display device displaying a user interface. The user interface may include a visualization of the IC having a plurality of blocks, wherein each block represents an element of the IC. The host data processing system visually differentiates a block of the plurality of blocks used during the emulation from a block of the plurality of blocks not used during the emulation.

The display device of the host data processing system also may display a user interface including a visualization of at least a portion of measurement data received from the emulation system.

The software emulation model may specify data traffic generated between a processor of the processor system and an I/O device of the processor system.

The host data processing system further may send at least one user selected setting for the performance monitor to the emulation system. For example, the at least one setting for the performance monitor specifies whether power monitoring is activated for the emulation.

The system also may include a performance monitor located in the processor system that generates further measurement data. The further measurement data is provided to the host data processing system.

A method includes receiving, within a host data processing system, user selection of a data traffic pattern and receiving, within the host data processing system, a user selection of a software emulation model. The method includes sending the data traffic pattern and the software emulation model from the host data processing system to a target platform having an IC including a processor system coupled to an emulation circuit. The method also may include emulating a system architecture by executing the software emulation model using the processor system and implementing the data traffic pattern using the emulation circuit. Measurement data is collected from emulating the system architecture and is provided from the IC to the host data processing system.

The method may include sending, from the host data processing system to the IC, runtime configuration data for the IC. The runtime configuration data may specify a plurality of settings for a memory interface of the IC that communicates with an external memory.

The processor system and the emulation circuit may be part of an emulation system that is automatically implemented within the IC of the target platform under control of the host data processing system.

The user selection of the data traffic pattern may select the data traffic pattern from a plurality of pre-defined data traffic patterns stored within the host data processing system.

The method also may include displaying, upon a display device of the host data processing system, a visualization of the IC having a plurality of blocks, wherein each block represents an element of the IC. The method further includes visually differentiating a block of the plurality of blocks used during the emulation from a block of the plurality of blocks not used during the emulation.

The method further may include displaying upon a display device of the host data processing system a visualization of at least a portion of the measurement data received from the IC.

In one aspect, executing the software emulation model generates data traffic between a processor of the processor system and an I/O device of the processor system.

The method may include sending, from the host data processing system to the IC, at least one user selected setting for a performance monitor implemented within the IC. For example, the at least one setting for the performance monitor may specify whether power monitoring is activated for the emulation.

The method also may include generating, using a performance monitor located in the processor system, further measurement data. The further measurement data may be provided to the host data processing system.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:

1. A system, comprising:
a host data processing system;
a target platform coupled to the host data processing system;
wherein the target platform comprises an emulation system, comprising:
a processor system;
an emulation circuit coupled to the processor system through an integrated circuit interconnect; and
a performance monitor coupled to the integrated circuit interconnect;
wherein the emulation system receives, from the host data processing system, a software emulation model and a data traffic pattern;
wherein the emulation system emulates a system architecture by executing the software emulation model within the processor system and implementing the data traffic pattern over the integrated circuit interconnect using the emulation circuit; and
wherein the emulation system provides, to the host data processing system, measurement data collected by the performance monitor during the emulation;
wherein the emulation circuit mimics behavior and power consumption of a selected circuit block in communicating with the processor system without performing a function of the circuit block.

2. The system of claim 1, wherein the emulation system is implemented within an integrated circuit of the target platform, the software emulation model is an application, and the data traffic pattern includes instructions that cause the emulation circuit to generate data to the processor system.

3. The system of claim 1, wherein the emulation system is automatically implemented within an integrated circuit of the target platform under control of the host data processing system.

4. The system of claim 1, wherein the data traffic pattern is selected from a plurality of pre-defined data traffic patterns stored within the host data processing system.

5. The system of claim 1, wherein the host data processing system comprises a display device displaying a user interface, the user interface comprising:
a visualization of the integrated circuit comprising a plurality of blocks, wherein each block represents an element of the integrated circuit;
wherein the host data processing system visually differentiates a block of the plurality of blocks used during the emulation from a block of the plurality of blocks not used during the emulation.

6. The system of claim 1, wherein the host data processing system comprises a display device displaying a user interface, the user interface comprising a visualization of at least a portion of measurement data received from the emulation system.

7. The system of claim 1, wherein the software emulation model specifies data traffic generated between a processor of the processor system and an I/O device of the processor system.

8. The system of claim 1, wherein the host data processing system further sends at least one user selected setting for the performance monitor to the emulation system.

9. The system of claim 1, further comprising:
a performance monitor located in the processor system generating further measurement data that is provided to the host data processing system.

10. A method, comprising:
receiving, within a host data processing system, user selection of a data traffic pattern;
receiving, within the host data processing system, user selection of a software emulation model;
sending the data traffic pattern and the software emulation model from the host data processing system to a target platform having an integrated circuit comprising a processor system coupled to an emulation circuit;
emulating a system architecture by executing the software emulation model using the processor system and implementing the data traffic pattern using the emulation circuit;
collecting measurement data from the emulating the system architecture; and
providing the measurement data from the integrated circuit to the host data processing system;
wherein the emulation circuit mimics behavior and power consumption of a selected circuit block in communicating with the processor system without performing a function of the circuit block.

11. The method of claim 10, wherein the software emulation model is an application and the data traffic pattern includes instructions that cause the emulation circuit to generate data to the processor system.

12. The method of claim 10, wherein the processor system and the emulation circuit are part of an emulation system that is automatically implemented within the integrated circuit of the target platform under control of the host data processing system.

13. The method of claim 10, wherein the user selection of the data traffic pattern selects the data traffic pattern from a plurality of pre-defined data traffic patterns stored within the host data processing system.

14. The method of claim 10, further comprising:
displaying, upon a display device of the host data processing system, a visualization of the integrated circuit comprising a plurality of blocks, wherein each block represents an element of the integrated circuit; and
visually differentiating a block of the plurality of blocks used during the emulation from a block of the plurality of blocks not used during the emulation.

15. The method of claim 10, further comprising:
displaying upon a display device of the host data processing system a visualization of at least a portion of the measurement data received from the integrated circuit.

16. The method of claim 10, wherein executing the software emulation model generates data traffic between a processor of the processor system and an I/O device of the processor system.

17. The method of claim 10, further comprising:
sending, from the host data processing system to the integrated circuit, at least one user selected setting for performance monitor implemented within the integrated circuit.

18. The method of claim 10, further comprising:
generating, using a performance monitor located in the processor system, further measurement data that is provided to the host data processing system.

* * * * *